(12) United States Patent
Craske

(10) Patent No.: US 10,409,721 B2
(45) Date of Patent: Sep. 10, 2019

(54) COMPARATOR AND MEMORY REGION DETECTION CIRCUITRY AND METHODS

(71) Applicant: ARM LIMITED, Cambridge (GB)

(72) Inventor: Simon John Craske, Cambridge (GB)

(73) Assignee: ARM LIMITED, Cambridge (GB)

( * ) Notice: Subject to any disclaimer, the term of this patent is extended or adjusted under 35 U.S.C. 154(b) by 11 days.

(21) Appl. No.: 15/681,467

(22) Filed: Aug. 21, 2017

(65) Prior Publication Data

US 2018/0074954 A1    Mar. 15, 2018

(30) Foreign Application Priority Data

Sep. 14, 2016   (GB) ..................... 1615639

(51) Int. Cl.
| | | |
|---|---|---|
| *G06F 5/10* | (2006.01) | |
| *G06F 7/02* | (2006.01) | |
| *G06F 12/02* | (2006.01) | |
| *G06F 7/509* | (2006.01) | |
| *G06F 17/50* | (2006.01) | |

(52) U.S. Cl.
CPC ............ *G06F 12/0292* (2013.01); *G06F 5/10* (2013.01); *G06F 7/02* (2013.01); *G06F 7/026* (2013.01); *G06F 7/509* (2013.01); *G06F 17/505* (2013.01); *G06F 2207/382* (2013.01)

(58) Field of Classification Search
CPC .................................................. G06F 12/0292
See application file for complete search history.

(56) References Cited

U.S. PATENT DOCUMENTS

| | | | | |
|---|---|---|---|---|
| 5,204,953 A | * | 4/1993 | Dixit ...................... | G06F 9/342 |
| | | | | 711/220 |
| 5,583,806 A | * | 12/1996 | Widigen ................. | G06F 7/509 |
| | | | | 708/708 |
| 5,590,351 A | * | 12/1996 | Sowadsky ................ | G06F 9/32 |
| | | | | 711/218 |
| 5,822,786 A | * | 10/1998 | Widigen ................. | G06F 7/026 |
| | | | | 711/209 |
| 5,961,581 A | * | 10/1999 | Muthusamy ........ | G06F 12/1433 |
| | | | | 708/670 |
| 6,047,364 A | | 4/2000 | Kolagotla et al. | |
| 7,263,673 B1 | | 8/2007 | McElvain et al. | |

OTHER PUBLICATIONS

Combined Search and Examination Report for GB1615639.0 dated Mar. 10, 2017, 7 pages.

* cited by examiner

*Primary Examiner* — Andrew Caldwell
*Assistant Examiner* — Emily E Larocque
(74) *Attorney, Agent, or Firm* — Nixon & Vanderhye PC

(57) ABSTRACT

Comparator circuitry comprises carry-save-addition (CSA) circuitry to generate a set of partial sum bits and a set of carry bits in respect of corresponding bit positions in a first input value, a second input value, a carry-in value associated with the first and second input values, and a third input value, the CSA circuitry comprising inverter circuitry to provide a relative inversion between the third input value and the group consisting of the first and second input values; and combiner circuitry to combine the set of partial sum bits, the set of carry bits offset by a predetermined number of bits in a more significant bit direction, the carry-in value and 1, to generate at least a carry output bit; in which the carry output bit is indicative of whether the third input value is greater than the sum of the first and second input values.

19 Claims, 7 Drawing Sheets

COMPARATOR AND MEMORY REGION DETECTION CIRCUITRY AND METHODS

This application claims priority to GB Patent Application No. 1615639.0 filed Sep. 14, 2016, the entire content of which is hereby incorporated by reference.

BACKGROUND

This disclosure relates to comparators, memory region detection, and methods. Comparator circuitry may be used to detect whether a value under test is above or below a threshold. An example of the use of such circuitry is found in memory region detection circuitry. This can be used, for example, in situations where it is desired to know whether a memory address is above or below a threshold address, or (if two separate thresholds are used) if it is within a memory region defined by upper and lower limit addresses.

For example, one or more attributes (such as programmable attributes) can be associated with memory regions, so that a detection of whether a memory address falls within that region can be used to control memory access to that address in dependence upon those one or more attributes. An example of such an attribute is an attribute indicating whether write operations can be performed to that memory region. Another example is whether the requesting entity (for example, an application or a virtual machine) has permission to access that memory region at all.

Some previously proposed arrangements use so-called bit masking in which a subset of address bits are compared with predetermined values, so that an address is detected to lie in a memory region if the subset of bits matches the mask. However, this requires the memory regions to be aligned with boundaries represented by particular address bits, and allows only limited flexibility in the size and alignment of the memory regions. To implement a single arbitrary memory region using bit masks can require a significant number of individual masks. Therefore, in other arrangements, an arithmetic comparison is used. Here, a memory address under test is compared by arithmetic comparison with upper and lower limit addresses to detect whether the address under test lies in a memory region defined by the upper and lower limit addresses. However, this arithmetic comparison can result in the address comparison, which can be on a critical path for memory and processor performance, imposing a delay corresponding to the time taken to perform the comparisons.

SUMMARY

In an example arrangement there is provided comparator circuitry comprising:

carry-save-addition (CSA) circuitry to generate a set of partial sum bits and a set of carry bits in respect of corresponding bit positions in a first input value, a second input value, a carry-in value associated with the first and second input values, and a third input value, the CSA circuitry comprising inverter circuitry to provide a relative inversion between the third input value and the group consisting of the first and second input values; and combiner circuitry to combine the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

In another example arrangement there is provided comparator circuitry comprising:

carry-save-addition (CSA) means for generating a set of partial sum bits and a set of carry bits in respect of corresponding bit positions in a first input value, a second input value, a carry-in value associated with the first and second input values, and a third input value, the CSA means comprising inverter means for providing a relative inversion between the third input value and the group consisting of the first and second input values; and combiner means for combining the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

In another example arrangement there is provided a method comprising:

generating a set of partial sum bits and a set of carry bits by carry-save-addition in respect of corresponding bit positions in a first input value, a second input value, a carry-in value associated with the first and second input values, and a third input value, the generating step including providing a relative inversion between the third input value and the group consisting of the first and second input values; and combining the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figures 1, 2, 3:
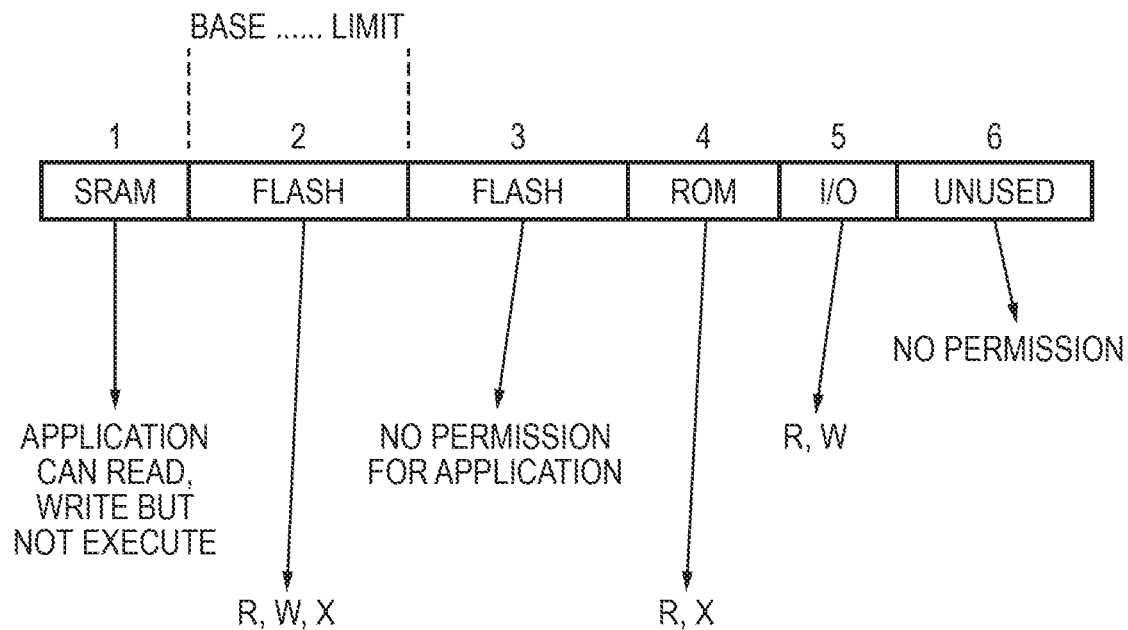
FIG. 1 schematically illustrates memory regions.
FIGS. 2 and 3 schematically illustrate memory region attribute data.

Before discussing the embodiments with reference to the accompanying figures, the following description of embodiments is provided.

An example embodiment provides comparator circuitry comprising:

carry-save-addition (CSA) circuitry to generate a set of partial sum bits and a set of carry bits in respect of corresponding bit positions in a first input value, a second input value, a carry-in value associated with the first and second input values, and a third input value, the CSA circuitry comprising inverter circuitry to provide a relative inversion between the third input value and the group consisting of the first and second input values; and combiner circuitry to combine the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

The example embodiment recognises that a delay involved in arithmetic compactors relates to resolving the carry-chain in multi-bit comparisons. The example embodiment also recognises that carry-save-addition (CSA) is a technique for computing the result of adding up to three values together without necessarily incurring such a severe delay. The example embodiment goes further, by recognising that a comparison between first and second values can be expressed as a carry when one of those values is subtracted from the other, and that a binary subtraction can be considered as an inversion plus the addition of one.

Depending on the desired polarity of the output signal, the comparator circuitry may comprise an output bit inverter to invert the carry output bit.

In examples the predetermined number of bits is one bit.

In place of a sum of first and second values, a substitute value can be used so that a selector is configured to selectively set one of the first and second input values to zero.

In some examples, the CSA circuitry is configured to generate the set of partial sum bits and a set of carry bits in dependence on the first input value, the second input value, and the inverse of the third input value. In these examples, the carry-save-addition circuitry may comprise: first circuitry to combine pairs of bits of the first input value and bits of the second input value to generate respective intermediate partial sum bits and respective intermediate carry bits; and second circuitry to combine the intermediate partial sum bits and intermediate carry bits with the inverse of the third input value.

In other examples, the CSA circuitry is configured to generate the set of partial sum bits and a set of carry bits in dependence upon the inverse of the first input value, the inverse of the second input value and the third input value. In these examples, the carry-save-addition circuitry may comprise: first circuitry to combine pairs of bits of the inverse of the first input value and bits of the inverse of the second input value to generate respective intermediate partial sum bits and respective intermediate carry bits; and second circuitry to combine the intermediate partial sum bits and intermediate carry bits with the third input value.

Such a comparator circuit can be useful in the context of a memory region detection circuitry (for example, a memory protection circuit or a watchpoint circuit) comprising:

a detector to detect whether a memory address under test lies within a range of memory addresses defined by a lower limit and an upper limit, the detector comprising:

first comparator circuitry, in which the third input value represents the lower limit; and second comparator circuitry, in which the third input value represents the upper limit;

output circuitry to generate an output flag in dependence upon the carry-out bits from the first and second comparator circuitries;

in which the memory address under test is formed as a sum of the first input value, the second input value and the carry-in value, and the output flag indicates whether the memory address under test lies within the range of memory addresses defined by the lower limit and the upper limit.

Such an arrangement can operate more quickly than previously proposed circuits using arithmetic comparators because of a reduced need to resolve multiple carry chains.

For example, two or more detectors can be used each having a respective upper limit and lower limit. In such examples, circuitry can be used to combine the output flags from the two or more detectors to generate an indication of whether the memory address under test In order to reduce the amount of circuitry, and in turn the use of area in an example integrated circuit implementation, each of the detectors has respective second circuitry; and the two or more detectors use common first circuitry.

To provide a bus address, for example, an address generator can be used to generate a memory address from the first input value, the second input value and the carry-in value.

This can also be used to provide a correction for modulo arithmetic in the addition of the first, second and third input values, in which: the address generator is configured to generate an address carry bit; and the combiner circuitry is configured to generate the carry output bit in dependence upon the address carry bit.

An example of use is in a watchpoint circuit or the like, comprising an interrupt generator configured to generate a processor interrupt in response to a memory address lying within the range of memory addresses defined by the lower limit and the upper limit.

Another example of use is in a memory protection circuitry comprising: memory region detection circuitry as discussed above, in which the upper limit and the lower limit define a given memory region having one or more associated attributes; the memory protection circuitry being configured to control access to a memory address detected to be in the memory region in dependence upon the one or more associated attributes.

Another example embodiment provides a saturating combiner comprising:

a data value combiner configured to combine two or more data values;

comparator circuitry as defined above, configured to compare an output of the data value combiner with one or more limit values; and a limiter responsive to the comparator circuitry to limit the output of the data value combiner to a limit value or the one or more limit values.

Another example embodiment provides comparator circuitry comprising:

carry-save-addition (CSA) means for generating a set of partial sum bits and a set of carry bits in respect of corresponding bit positions in a first input value, a second input value, a carry-in value associated with the first and second input values, and a third input value, the CSA means comprising inverter means for providing a relative inversion between the third input value and the group consisting of the first and second input values; and combiner means for combining the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

Another example embodiment provides a method comprising:

generating a set of partial sum bits and a set of carry bits by carry-save-addition in respect of corresponding bit positions in a first input value, a second input value, a carry-in value associated with the first and second input values, and a third input value, the generating step including providing a relative inversion between the third input value and the group consisting of the first and second input values; and combining the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

Referring now to FIG. 1, an example of a memory map is provided in order to illustrate an implementation of multiple memory regions. FIG. 1 represents memory addresses along a horizontal axis, for example running from a lower (or a lowest) memory address at the left side to a higher (or a highest) memory address at the right side. The memory address space is allocated to different purposes. In the example of FIG. 1, six memory regions (numbered as memory regions 1 . . . 6) are provided, with memory region 1 being allocated to static random access memory (SRAM), memory regions 2 and 3 being allocated to flash RAM, memory region 4 being allocated to read only memory (ROM), memory region 5 being mapped to input/output (I/O) devices and memory region 6 being unused.

The memory regions of FIG. 1 can be associated with different permissions, for example permissions applicable to an application running on a processor or virtual machine associated with the memory represented by this memory map. Examples of such permissions are illustrated in FIG. 1; for example, in memory region 1, the application can read and/or write data but not execute instructions in that memory region. In memory region 2, the application can read, write and execute. Memory region 3 has no permissions for the application so the application is not permitted to access that memory region at all. In memory region 4, the application can read or execute. In memory region 5, the application can read and/or write, and no permission is provided to memory region 6.

These examples of permissions are based upon the type of circuitry mapped to that region of the overall memory map and also to properties of an application running on a processor accessing that memory map. However, other types of permission or similar attributes may be associated with memory regions, for example in connection with security levels associated with executing code, so that for a particular security level, access to some memory regions is allowed but access to others is not. In examples, the security levels might form a hierarchy of two or more security levels, so that a higher security level might imply access to memory regions for which access denied to code executing at a lower security level. Indeed, the storage of memory region data in a memory region store (see below) may itself be an example of a memory transaction which can be carried out only at a higher security level.

Alternatively, a memory region may simply be associated with an indication that the memory region may be validly accessed or not. That is to say, in response to such an indication, a memory transaction relating to a memory address in that region is either allowed to proceed or disallowed.

FIG. 2 schematically illustrates memory region attribute data indicating whether the example application discussed above may validly access each of the memory regions of FIG. 1. Here, memory region data 10 comprises, for each of the memory regions, a validity flag 20 indicating whether an access can validly be made to that memory region.

In other examples, the validity flag mentioned in respect of FIG. 2 could be implied, in that memory region data could specify (at a general level, or for an application, or for a particular security level or the like) memory regions in which transactions are allowed, so that for any memory address not within such a region a transaction is disallowed. An example in this form is discussed below with reference to FIG. 7.

FIG. 3 shows an alternative arrangement in which memory region data 30 provides, for each of the memory regions, a read (R), write (W) and execute (X) flag indicating whether those operations can be performed at that memory region. Here a tick (✓) indicates that a type of transaction is allowed, and a cross (x) indicates that the transaction type is disallowed.

Other examples of attributes indicate the sharable status of a memory region, whether or not instructions within that memory region can be reordered for execution, and the like.

The memory regions can be defined in various ways. An example shown in FIG. 1 is to define a lower limit memory address ("BASE") and an upper limit memory address ("LIMIT") so that a memory address falls within the region if:

BASE<=memory address<=LIMIT

Other examples may define a base address and a region size. This is functionally equivalent to the arrangement discussed above in that the upper limit address is then equal to the base address plus the region size. Further examples may (also equivalently) define an upper limit address and a region size.

Figure 4:
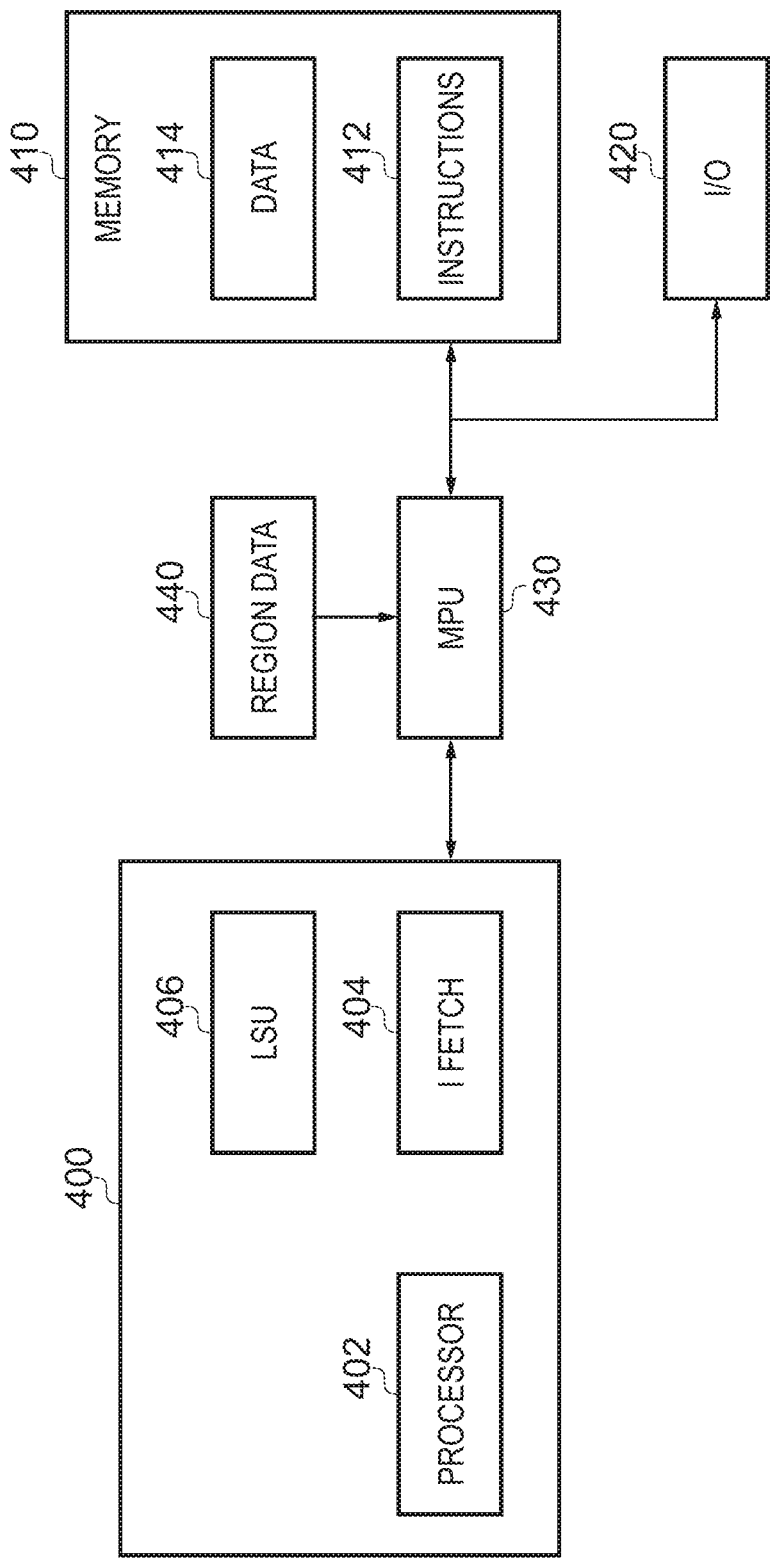
FIG. 4 schematically illustrates a data processing system.

FIG. 4 schematically illustrates a data processing system comprising a processing element 400, a memory system 410 storing, for example, processor instructions 412 and data 414, input/output circuitry 420, a memory protection unit 430 and a region data store 440.

The processing element 400 executes the processor instructions fetched from the memory 410. For clarity and ease of explanation, only certain features of the processing element 400 are shown in FIG. 4, and the skilled person will appreciate that other features may be included. The relevant features shown in FIG. 4 include a processor 402, an instruction fetch (I FETCH) unit 404 and a load-store unit 406 (LSU). Under the control of program code running on the processor 402 (for example, an application program) memory access operations can be initiated by the IFETCH unit 404 or the LSU 406. These operations are classed as memory transactions. The memory protection unit (MPU) 430, by consulting the region data stored in the region data store 440, either allows or disallows the transactions to take place.

In some examples, memory addresses are generated by adding two values together, for example, the contents of a register can be added to another value (for example, a value specified as an operand of a processing instruction) to give a memory address which depends on the value specified in the operand and the value stored in that register.

Figure 5:
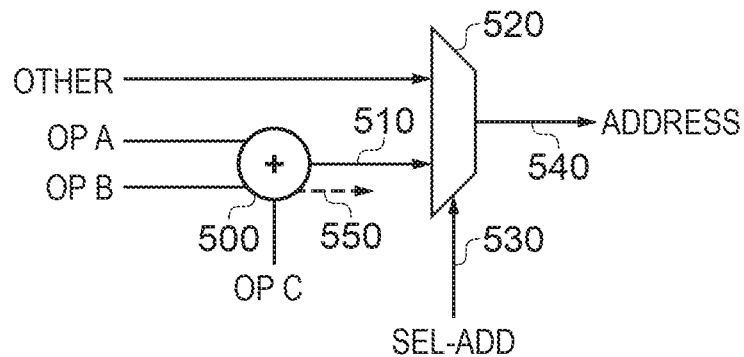
FIG. 5 schematically illustrates a memory address generator.

FIG. 5 schematically illustrates a memory address generator applicable in these situations.

In FIG. 5, an adder 500 adds together two operands, OP-A, OP-B along with a carry-in value OP-C. The output of the adder 510 is passed to a multiplexer 520 which also receives a value (OTHER) representing a memory address which does not require such an addition operation. The multiplexer 520 selects either the output 510 of the adder or the address "OTHER" in dependence upon a selection signal SEL_ADD 530 to generate an output memory address 540.

FIG. 5 therefore provides an example of an address generator to generate a memory address from a first input value, a second input value and a carry-in value.

In some applications, such as an application discussed below with reference to FIG. 13, the address generator is configured to generate an address carry bit 550 from the addition by the adder 500. Such a carry bit is not necessarily needed in some circumstances but can be useful in the example arrangement of FIG. 13. The use of such an address carry bit will be discussed further below.

Figure 6:
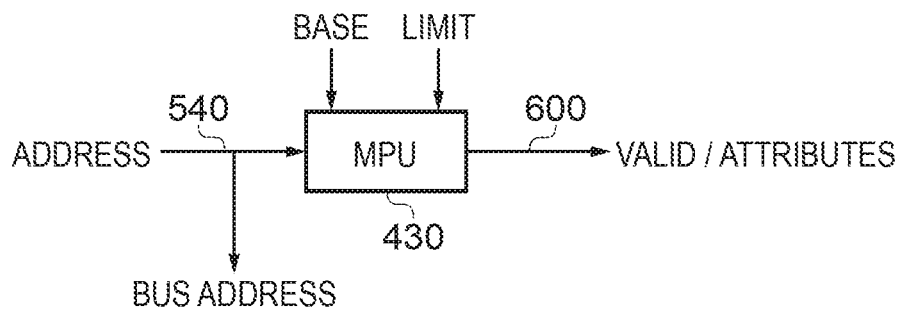
FIG. 6 schematically illustrates a memory protection unit.

FIG. 6 schematically illustrates part of the operation of the memory protection unit 430 of FIG. 4. In this example, the address 540 is compared by the MPU 430 to respective BASE and LIMIT addresses. If the address 540 lies within a region defined by the lower limit (BASE) and upper limit (LIMIT) addresses then the transaction is deemed to be valid and a validity indication 600 is output by the MPU. Separately, the address 540 is provided as a bus address to access the relevant portion of memory or other memory-mapped device, subject to the validity indication indicating that the transaction is valid and allowable.

Figure 7:
FIGS. 7 to 9 provide schematic examples of region data.
Figure 8:
Figure 9:

FIGS. 7 to 9 provide schematic examples of region data which might be referred to by the MPU 430.

In FIG. 7, a BASE address and a LIMIT address are provided, with the arrangement being that if a memory address is between a BASE and a LIMIT address in the region data, the transaction is allowable. In other words, as mentioned in connection with FIG. 2, a "validity flag" is implied, in that a transaction in respect of a memory address falling within the region defined by BASE and LIMIT in FIG. 7 is considered to be an allowable transaction; otherwise it is considered not to be an allowable transaction.

In FIG. 8, for each memory region, the memory region is defined by BASE and LIMIT addresses and attributes are also provided to indicate the nature of transactions which are allowable within that memory region. The attributes may simply be an "allowable" flag, or may include other attributes such as those discussed in connection with FIG. 3.

A further example is provided in FIG. 9, in which BASE and LIMIT addresses define a memory region, and translation information indicates a memory address translation (for example from a virtual address to a physical address or an intermediate physical address) applicable to that memory region.

A feature common to these arrangements is the need for a comparison to detect whether a memory address under test (such as a memory address relating to a proposed transaction) is inside or outside of a memory region defined by lower and upper limit values.

Figure 10:
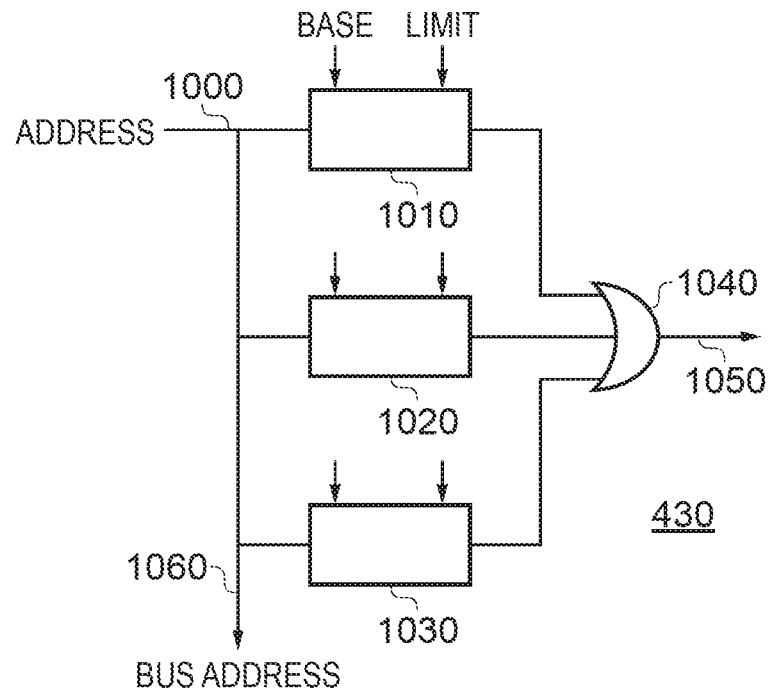
FIG. 10 schematically illustrates a memory protection unit.

FIG. 10 schematically illustrates, in more detail, a memory protection unit such as the MPU 430. Here, an address under test 1000 is provided to multiple comparators 1010, 1020, 1030 (of which three are shown but various numbers could be provided) each of which compares the address 1000 with respective BASE and LIMIT addresses. The outputs of the comparators 1010, 1020, 1030 are combined by an OR gate 1040 such that if the transaction is deemed to be allowable by any of the comparators then an output valid signal 1050 is generated to indicate that the transaction is allowable. The address 1000 is also provided as a bus address 1060 for the memory access, as discussed above.

FIGS. 6 and 10 provide an example of memory protection circuitry comprising memory region detection circuitry of the form to be discussed below, in which the upper limit and the lower limit define a given memory region having one or more associated attributes; the memory protection circuitry being configured to control access to a memory address detected to be in the memory region in dependence upon the one or more associated attributes.

An issue which can arise with the type of arrangement shown in FIG. 10 is that the detection of whether a memory transaction is allowable can lie within a critical path for achieving processor performance, but arithmetic comparators can be slow in operation because of their reliance upon resolving multiple chains of carry values in multi-bit comparisons.

Figure 11:
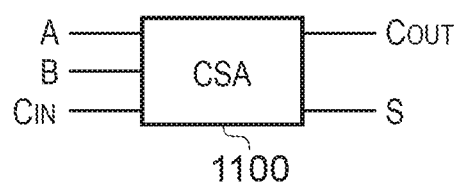
FIG. 11 schematically illustrates a carry-save-addition circuit.

FIG. 11 schematically illustrates a carry-save-addition (CSA) circuit 1100.

CSA circuitry provides an established scheme for computing the result of adding three values together without incurring the delay of solving a carry-chain twice.

In the example of FIG. 11, respective bits of the inputs A, B and Carry-in are provided to the CSA circuit 1100. If exactly one of those bits (which could be any one of them) is a "1" then the output Sum value is 1. If exactly two of the input bits is a 1, then the Carry-out is 1 and the Sum output is 0. If all three of the input bits are 1 then both C-Out and S are 1.

CSA circuitry of the type discussed in connection with FIG. 11 can be useful in the context of a comparator circuit, and can be used in an MPU of the type shown in FIG. 10, for example, or other circuitry to be discussed below with reference to FIG. 16, for example. However, the use of such circuitry in a comparator circuit (whether or not such a comparator circuit is itself used in the arrangements of FIG. 13 or 16) is considered to represent an embodiment of the present disclosure.

The present arrangements can make use of a CSA circuit but the overall approach to providing a comparator function differs from a simple CSA circuit in several significant ways.

Consider a comparison of a value "test" with either a lower limit value or an upper limit value.

The comparison with the lower limit value is equivalent to: "Is test>=lower limit value?". This is equivalent to a negation of the outcome "Is lower limit value>test?" which in turn can be represented by the carry out value (underflow) from the subtraction (test−lower limit value).

For example, if test=lower limit value then the subtraction (test−lower limit value)=0 with no underflow. If test>lower limit value then the subtraction (test−lower limit value)=(a positive value) with no underflow. If test<lower limit value then the subtraction (test−lower limit value) generates an underflow or carry out bit.

Therefore, the outcome of the detection "is test >=lower limit value?" can be represented by the carry-out bit of the subtraction (test−lower limit value), in that the carry-out bit is 1 if the detection is false (which is to say that test<lower limit value) or 0 otherwise.

Similarly, the comparison with the upper limit value is equivalent to: "Is test<=upper limit value?" which in turn can be represented by the carry out value (underflow) from the subtraction (upper limit value−test). This carry out bit is 1 if the test outcome is false (which is to say that test>upper limit value) and 0 if the test outcome is true.

For convenience, the carry out bit can be inverted in each case so as to provide a 1 if the condition is true (either test>=lower limit value or test<=upper limit value, as the case may be).

It is also noted that the function "X−Y" can equivalently be expressed as "X+~Y+1", where the notation ~Y indicates the bitwise inverse of Y.

Figure 12:
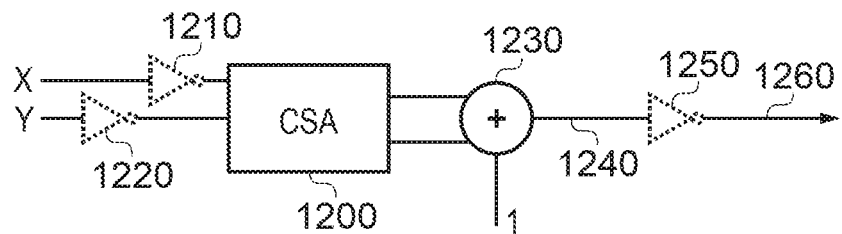
FIG. 12 schematically illustrates comparator circuitry.

Turning now to the use of CSA techniques, the sum "X+~Y" can be carried out using CSA circuitry. A simplified example is shown in FIG. 12.

The values X and Y are provided to CSA circuitry 1200. An inverter 1210, 1220 is provided in respect of either the value X (to generate ~X) or the value Y (to generate ~Y).

For multi-bit values X and Y, the CSA circuitry 1200 generates a set of pairs of sum bits and carry bits. In other words, each bit position in the values X and Y generates a sum bit S and a carry bit C.

The sum bits and carry bits are then added together. It is noted however that a carry bit C of an S-C pair refers to a bit position shifted by one bit (or more general, by a predetermined number of bits which may be 1 or another value) in a more-significant direction compared to the corresponding sum bit S of that pair. Therefore, before adding the sum and carry bits together, the set of carry bits are all shifted by one bit.

The inputs to and outputs from the CSA circuitry 1200 in FIG. 12 are represented as follows (in an example implementation of X+~Y):

| Bit of value X | Bit of value ~Y | Sum bit | Carry bit |
|---|---|---|---|
| $X_0$ | $Y_0$ | $S_0$ | $C_0$ |
| $X_1$ | $Y_1$ | $S_1$ | $C_1$ |
| $X_2$ | $Y_2$ | $S_2$ | $C_2$ |
| $X_3$ | $Y_3$ | $S_3$ | $C_3$ |
| $X_4$ | $Y_4$ | $S_4$ | $C_4$ |
| ... | ... | ... | ... |
| $X_n$ | $Y_n$ | $S_n$ | $C_n$ |

The carry bits are shifted (in a more-significant direction) by one bit position before the sum bits and carry bits are added together by an adder 1230. A value of 1 is also added, to provide the equivalent of the negation discussed above.

| Sum bit | Carry bit (shifted) |
|---|---|
| $S_0$ + | 0 |
| $S_1$ + | $C_0$ |
| $S_2$ + | $C_1$ |
| $S_3$ + | $C_2$ |
| $S_4$ + | $C_3$ |
| ... + | ... |
| $S_n$ + | $C_{n-1}$ |
| 0 + | $C_n$ |

Separately, values can be inserted as a new most-significant sum bit and a new least-significant carry bit, but these possibilities will be discussed below. For now, a 0 has been inserted in those positions in the table shown above.

The multi-bit addition shown above is carried out by the adder 1230. A carry-out bit 1240 is generated from that addition. This carry-out bit can be inverted by an inverter (as an example of an output bit inverter) as discussed above, to generate an inverted carry-out bit 1260 to form an indication of the result of the comparison.

The discussion of FIG. 12 was based on two arbitrary values X and Y. It will be appreciated that depending on which inverted 1210, 1220 is used, this therefore provides an example of a comparator circuit which generates an output (1240 or its inverted version 1260) indicative of whether X>=Y, or Y>=X, or X>Y, or Y>X using CSA circuitry.

As discussed above, however, such comparator circuitry can find a use in memory region detection circuitry.

In such circuitry, a typical test to be carried out is whether the sum of values A and B (which may have an associated carry-in value) is greater than or equal to a value BASE, and/or is less than or equal to a value LIMIT.

By comparison with FIG. 12, this would imply that either BASE or LIMIT may be represented by one of the values X, Y, and the sum of A, B and the carry-in may be represented by the other of the values X, Y.

CSA techniques can be used in order that even in this scenario of a comparison of one value with the sum of other values, only one carry chain needs to be resolved, which is the equivalent of the carry chain at the adder 1230.

Figure 13:
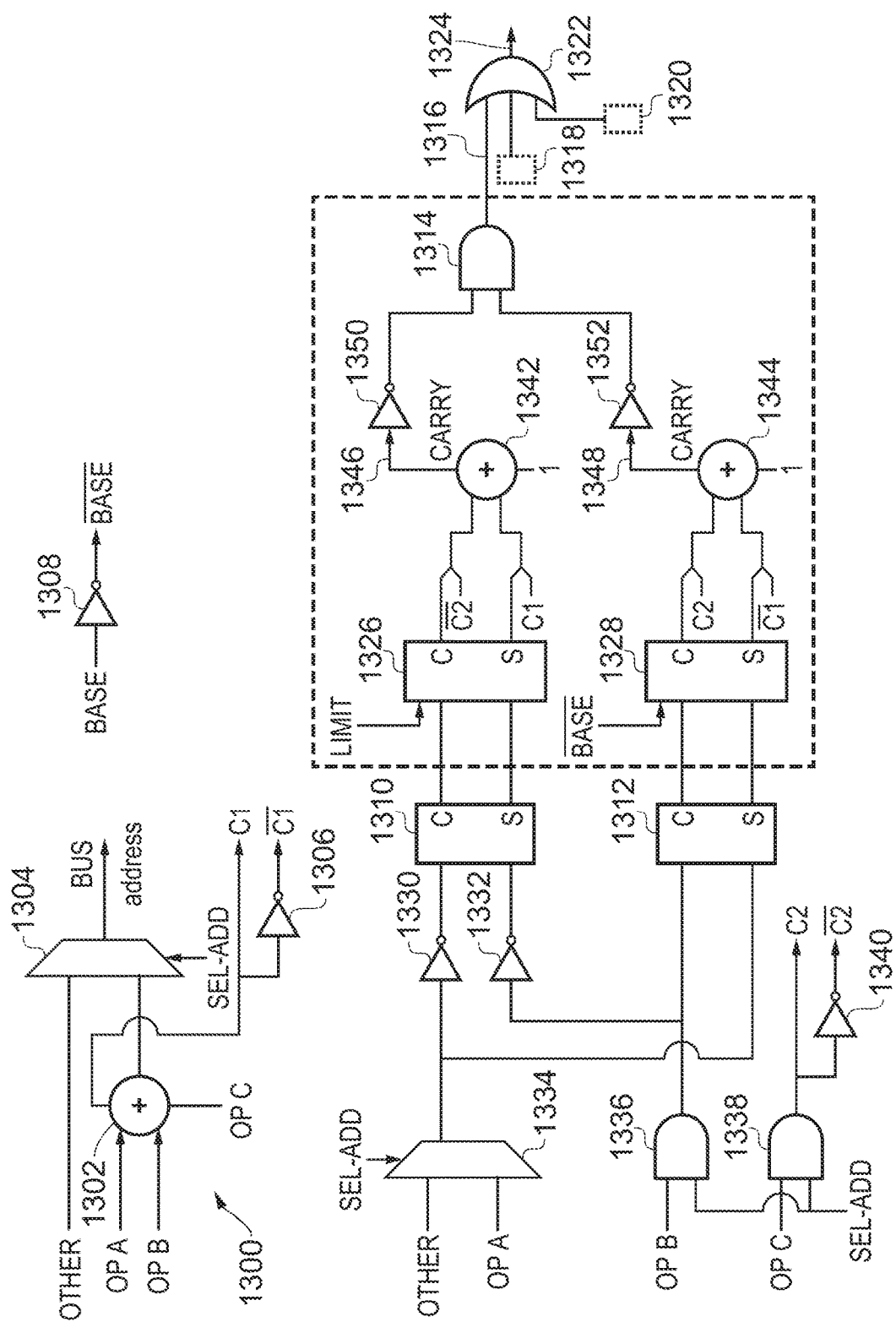
FIG. 13 schematically illustrates a memory protection unit.

FIG. 13 provides an example of how this can be achieved.

In FIG. 13, an address generator 1300 is similar to that shown in FIG. 5 and comprises an adder 1302, a multiplexer 1304 and an inverter 1306. The adder 1302 and the multiplexer 1304 operate in the same manner as the equivalent components shown in FIG. 5, so that the adder 1302 combines input operands OP-A, OP-B and a carry-in value OP-C, generating an address (which is passed to the multiplexer 1304) and a carry-out value C1. The inverter 1306 generates an inverted version of C1, ~C1 (the notation of a bar above the variable name, that is to say $\overline{C1}$, is used in FIG. 13). The way in which C1 and ~C1 are used will be discussed below. the output of the multiplexer is either dependent upon the output of the adder 1302 or upon another address OTHRE, under the control of a selection signal SEL_ADD.

Variables BASE and LIMIT are stored in region data storage (not shown in FIG. 13, but as described with respect to FIG. 4). An inverter 1308 inverts BASE to form ~BASE. Note that the value ~BASE could itself be stored in the region data storage, in place of or in addition to BASE. The comparison is being performed with BASE, but ~BASE is used as part of the present circuitry.

The circuitry of FIG. 13 implements two comparison functions, namely whether the address under test >=BASE, and whether the address under test <=LIMIT. Both of these tests must be passed in order for the address under test to be considered to lie within the region defined by BASE and LIMIT. In FIG. 13 the two tests are carried out substantially in parallel, and an AND gate 1314 combines the two test results to generate a "valid" signal 1316 if both tests are passed.

The circuitry can include multiple instances (shown schematically as 1318, 1320 . . . ) of the comparators, each responsive to respective BASE and LIMIT addresses in a similar manner to the schematic diagram of FIG. 10. These are examples of two or more detectors each having a respective upper limit and lower limit. The "valid" signals from each such instance are combined by an OR gate 1322 (as an example of circuitry to combine the output flags from the two or more detectors) to generate an indication of whether the memory address under test so as to generate a combined "valid" signal 1324 which indicates validity if any one (or more) of the separate valid signals is set.

CSA techniques are used in the circuitry of FIG. 13. The CSA addition is implemented as two stages. In first CSA circuitry 1310, 1312, the addition of OP-A and OP-B is carried out. This first CSA circuitry needs only to be implemented once amongst all of the instances of the circuitry (including the instances 1318, 1320 . . . ). The single implementation of the first CSA circuitry 1310, 1312 can reduce the area required to implement (for example) an MPU in an integrated circuit implementation. This is an example of each of plural detectors has respective second circuitry; and the two or more detectors use common first circuitry.

The results generated by the first CSA circuitry can be provided in parallel to second CSA circuitry 1326, 1328, which is implemented once for each instance (that is to say, once for each set of BASE, LIMIT).

The first CSA circuitry 1310 receives the values ~OP-A and ~OP-B, as generated by inverters 1332 and performs two-input CSA addition on them. The first CSA circuitry 1312 receives the values OP-A and OP-B and performs to-input CSA addition on them.

Note that the SEL_ADD signal also controls a multiplexer 1334 and two AND gates 1336, 1338, so that if SEL_ADD is set so as to select the address OTHER, then ~OTHER is provided to the first CSA circuitry 1310 in place of ~OP-A, and OP-B, OP-C are set to zero. Note that the symmetry of the arrangement means that OTHER could instead be substituted in place of OP-B rather than in place of OP-A. The selection of OTHER in this way provides an example of a selector configured to selectively set one of the first and second input values to zero.

The value OP-C (the carry-in value) is used in non-inverted form C2 and in inverted form ~C2 (by an inverter 1340) in a manner to be described below.

The output of the first CSA circuitry 1310 is provided, with the value LIMIT, to the second CSA circuitry 1326. The output of the first CSA circuitry 1312 is provided, with the value ~BASE, to the second CSA circuitry 1326. In each case the second CSA circuitry 1326, 1328 performs a three-input CSA addition on the respective inputs to generate sum S and carry C outputs.

The sum and carry outputs of each second CSA circuitry are added together and to a value 1 (as discussed above with reference to FIG. 12) by a respective adder 1342, 1344. Before the addition takes place, bit-shifting of the C values is carried out as discussed above. However, in the vacant bit positions of the least significant carry bit and the most significant sum bit, other values are inserted before the addition takes place.

In the case of the adder 1342, the insertions are:

| Sum bit | | Carry bit (shifted) |
|---|---|---|
| $S_0$ | + | ~C2 (from the inverter 1340) |
| $S_1$ | + | $C_0$ |
| $S_2$ | + | $C_1$ |
| $S_3$ | + | $C_2$ |
| $S_4$ | + | $C_3$ |
| ... | + | ... |
| $S_n$ | + | $C_{n-1}$ |
| C1 (from the adder 1302) | + | $C_n$ |

In the case of the adder 1344, the insertions are:

| Sum bit | | Carry bit (shifted) |
|---|---|---|
| $S_0$ | + | C2 (from the AND gate 1338) |
| $S_1$ | + | $C_0$ |
| $S_2$ | + | $C_1$ |
| $S_3$ | + | $C_2$ |
| $S_4$ | + | $C_3$ |
| ... | + | ... |
| $S_n$ | + | $C_{n-1}$ |
| ~C1 (from the inverter 1306) | + | $C_n$ |

The reason why each of these is inserted will now be discussed.

Considering first the value C1 and its inverse ~C1, the insertion of this value is to enable a valid result to be achieved based on an addition of OP-A and OP-B modulo $2^n$ (where n is the number of bits in OP-A or OP-B, for example n=32). Any carry-out value generated by the addition carried out by the adder 1302 is effectively used to invert the carry-out from the comparison performed by the first and second CSA circuitry. In other words, if the addition of OP-A, OP-B and OP-C generated a value greater than $2^n$, given that only the first n bits of that value would actually be used as a memory address, it needs to be treated as modulo-$2^n$. A result from the first and second CSA circuitries could provide a carry-out value which is not a result of the comparison but instead arises because OP-A+OP-B+OP-C is greater than $2^n$. So this needs to be inverted if C1 is equal to 1. An elegantly simple way of providing this inversion is to insert C1 (or its inverse in the case of the adder 1344) as a new most significant bit of one of the operands provided to the adder 1342, 1344. A vacant space in the sum bits provides a convenient place to insert this value. In this way, the combiner circuitry is configured to generate the carry output bit in dependence upon the address carry bit.

Considering C2 and its inverse ~C2, this could have been added into OP-A and OP-B at the first CSA circuitry stage, but that would have made that circuitry more complex (taking more space in an integrated circuit implementation). Instead, use can be made of the vacant least significant bit position in the C bits output by the second CSA circuitries 1326, 1328 to allow C1 or its inverse to be added in at that stage.

Each of the adders 1342, 1344 adds 1 as discussed above. The output carry bits 1346, 1348 are inverted by inverters 1350, 1352 before being supplied to the AND gate 1314 as discussed above.

FIG. 13 therefore provides an example of comparator circuitry comprising: carry-save-addition (CSA) circuitry to generate a set of partial sum bits and a set of carry bits in respect of corresponding bit positions in a first input value (such as OP-A), a second input value (such as OP-B), a carry-in value (such as OP-C) associated with the first and second input values, and a third input value (BASE or LIMIT), the CSA circuitry comprising inverter circuitry to provide a relative inversion between the third input value and the group consisting of the first and second input values; and combiner circuitry (such as one or both of the adders 1342, 1344) to combine the set of partial sum bits, the set of carry bits offset by a predetermined number of bits in a more significant bit direction, the carry-in value and 1, to generate at least a carry output bit; in which the carry output bit is indicative of whether the third input value is greater than the sum of the first and second input values.

In summary, FIG. 13 schematically illustrates memory region detection circuitry comprising a detector to detect whether a memory address under test lies within a range of memory addresses defined by a lower limit (such as BASE) and an upper limit (such as LIMIT), the detector comprising:

first comparator circuitry in which a third input value represents the lower limit; and second comparator circuitry in which a third input value represents the upper limit;

output circuitry to generate an output flag 1316 in dependence upon the carry-out bits 1346, 1348 from first and second comparator circuitries;

in which the memory address under test is formed as a sum of a first input value (OP-A), a second input value (OP-B) and a carry-in value (OP-C), and the output flag indicates whether the memory address under test lies within the range of memory addresses defined by the lower limit and the upper limit.

In some examples, the CSA circuitry is configured to generate the set of partial sum bits and a set of carry bits in dependence on the first input value, the second input value, and the inverse of the third input value (BASE in the above examples). In this case, the carry-save-addition circuitry may comprise first circuitry to combine pairs of bits of the first input value and bits of the second input value to generate respective intermediate partial sum bits and respective intermediate carry bits; and second circuitry to combine the intermediate partial sum bits and intermediate carry bits with the inverse of the third input value.

In other examples the CSA circuitry is configured to generate the set of partial sum bits and a set of carry bits in dependence upon the inverse of the first input value, the inverse of the second input value and the third input value (LIMIT for example). In this case, the carry-save-addition circuitry may comprise: first circuitry to combine pairs of bits of the inverse of the first input value and bits of the inverse of the second input value to generate respective intermediate partial sum bits and respective intermediate carry bits; and second circuitry to combine the intermediate partial sum bits and intermediate carry bits with the third input value.

Figure 14:
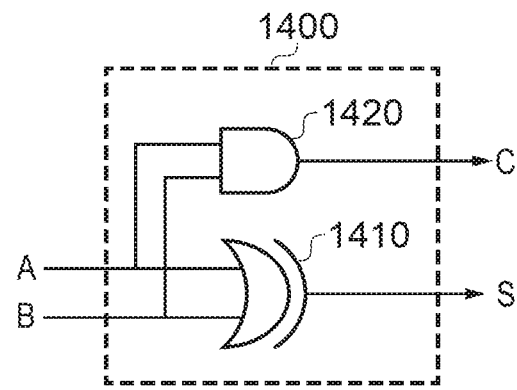
FIG. 14 schematically illustrates first CSA circuitry.

FIG. 14 schematically illustrates an example 1400 of first CSA circuitry 1310, 1312 of FIG. 13. Respective bits of two inputs, A and B, are provided to an exclusive-OR (XOR) gate 1410 which generates the S output, and to an AND gate 1420 which generates the C output. It will be appreciated that the arrangement of FIG. 14 is just one example of the implementation of this functionality, and other functionally-equivalent circuitry could be used.

The following table illustrates the inputs to and outputs from the circuitry of FIG. 14.

| A | B | S = A XOR B | C = A AND B |
|---|---|---|---|
| 0 | 0 | 0 | 0 |
| 0 | 1 | 1 | 0 |
| 1 | 0 | 1 | 0 |
| 1 | 1 | 0 | 1 |

Figure 15:
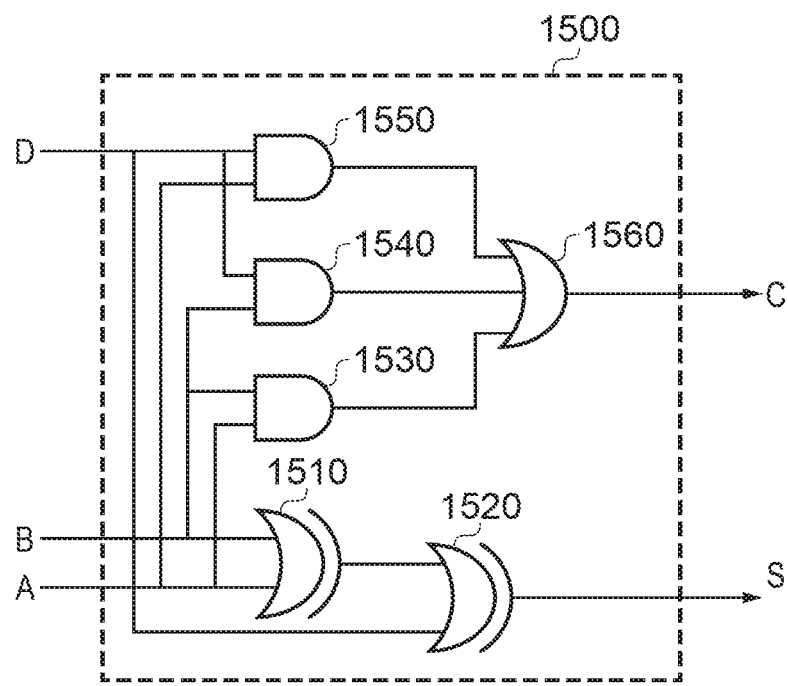
FIG. 15 schematically illustrates second CSA circuitry.

FIG. 15 schematically illustrates an example 1500 of second CSA circuitry 1326, 1328 of FIG. 13.

Respective bits of three inputs, A, B and D are handled by the circuitry. If exactly one (which could be any one) of those input bits is 1, then S=1 and C=0. If exactly two of those input bits is 1, then S=0 and C=1. If all three of those bits are 1, then S=C=1.

To generate S, two of the input bits (in this example, A, B) are combined by an exclusive-OR gate 1510, and the result is combined with the remaining input bit by another exclusive-OR gate 1520. The following table illustrates the inputs to and the S output from the circuitry of FIG. 15.

| A | B | D | A XOR B | S = (A XOR B) XOR D |
|---|---|---|---|---|
| 0 | 0 | 0 | 0 | 0 |
| 0 | 0 | 1 | 0 | 1 |
| 0 | 1 | 0 | 1 | 1 |
| 0 | 1 | 1 | 1 | 0 |
| 1 | 0 | 0 | 1 | 1 |
| 1 | 0 | 1 | 1 | 0 |
| 1 | 1 | 0 | 0 | 0 |
| 1 | 1 | 1 | 0 | 1 |

The C output from FIG. 15 is generated by three AND gates 1530, 1540, 1550 combining respective pairs of the input bits, with the outputs of the three AND gates being combined by an OR gate 1560. The following table illustrates the inputs to and the C output from the circuitry of FIG. 15.

| A | B | D | A & B | A & D | B & D | Carry = (A & B) OR (A & D) OR (B & D) |
|---|---|---|---|---|---|---|
| 0 | 0 | 0 | 0 | 0 | 0 | 0 |
| 0 | 0 | 1 | 0 | 0 | 0 | 0 |
| 0 | 1 | 0 | 0 | 0 | 0 | 0 |
| 0 | 1 | 1 | 0 | 0 | 1 | 1 |
| 1 | 0 | 0 | 0 | 0 | 0 | 0 |
| 1 | 0 | 1 | 0 | 1 | 0 | 1 |
| 1 | 1 | 0 | 1 | 0 | 0 | 1 |
| 1 | 1 | 1 | 1 | 1 | 1 | 1 |

Figure 16:
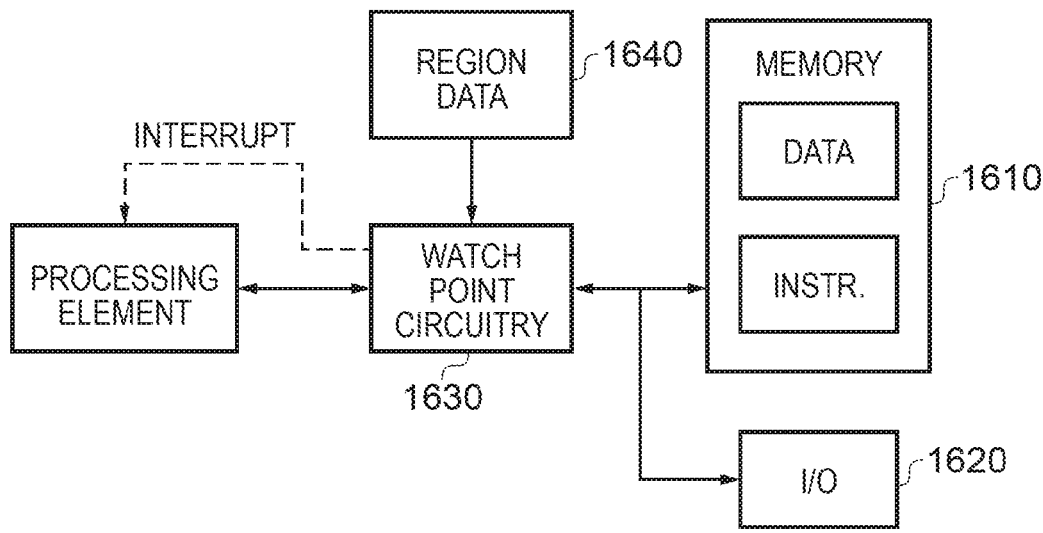
FIG. 16 schematically illustrates watchpoint circuitry.

FIG. 16 schematically illustrates another example use of the present techniques and example comparators. FIG. 16 is similar in several respects to FIG. 4 in that a processing element 1600 interacts with a memory system and memory-mapped I/O 1620. A so-called watchpoint circuit 1630, responsive to memory region data stored in a region data store 1640, is provided.

The watchpoint circuit 1630 operates (for example) as part of a hardware debugging or analysis system. If a transaction to a memory address defined by the region data stored in the region data store 1630 is detected, the watchpoint circuit 1630 issues a processor interrupt to the processing element 1600 which in turn causes the processing element to execute an interrupt routine. In this way, the processing element can execute program code in a normal way but if a memory transaction to an address lying in one or more memory regions under test is detected, the processing element can execute the interrupt routine, for example to generate trace data or to provide a dump of at least some processing parameters at that time.

The watchpoint circuit can operate in the same way as the memory protection unit circuitry discussed above, so as to compare the address associated with a current memory transaction with region data defining BASE and LIMIT addresses. Instead of generating a "valid" indication, the same circuitry can generate an interrupt signal. So, in the circuitry of FIGS. 10 and 13, the valid signal is in fact used as an interrupt signal.

The watchpoint circuit of FIG. 16 therefore provides an example of an interrupt generator configured to generate a processor interrupt in response to a memory address lying within the range of memory addresses defined by a lower limit and an upper limit.

Figure 17:
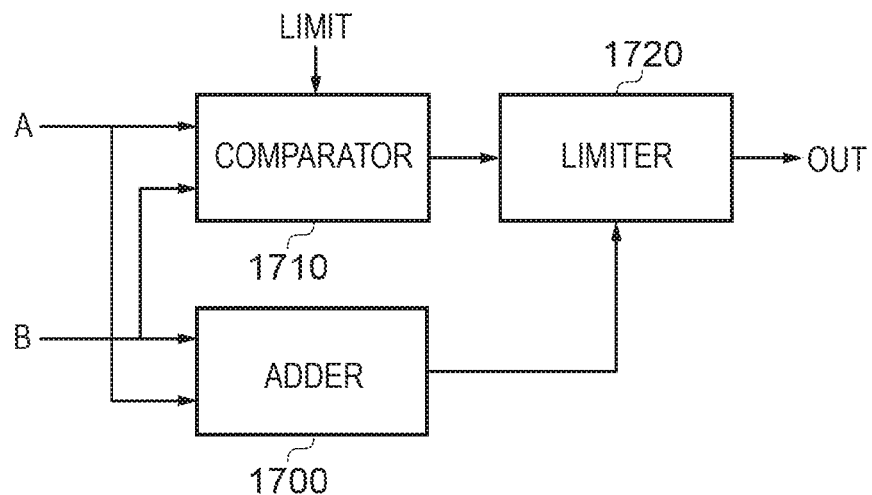
FIG. 17 schematically illustrates a saturating adder.

Another example use of the present techniques is in the context of a saturating adder (or subtractor, or other combiner or operation). An example of a saturating adder is shown schematically in FIG. 17. A saturating adder adds two values such that the result can be up to but not exceeding a limit value.

Input values A and B are added by an adder 1700 and are passed to a comparator 1710 which detects (for example, using a processing chain including the inverters whether the adder output is less than or equal to a value LIMIT. If so then a limiter 1720 passes that value as an output of the saturating adder. If not (which is to say, the adder value is detected to be greater than LIMIT) the limiter limits the output value to LIMIT. This provides an example of a saturating combiner comprising: a data value combiner (such as 1700) configured to combine two or more data values; comparator circuitry such as 1710 configured to compare an output of the data value combiner with one or more limit values; and a limiter such as 1720 responsive to the comparator circuitry to limit the output of the data value combiner to a limit value or the one or more limit values.

Figure 18:
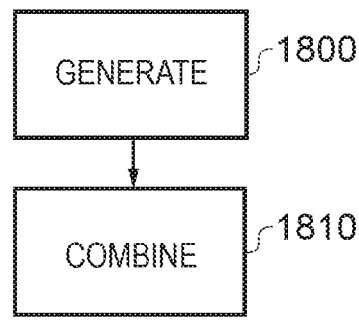
FIG. 18 is a schematic flowchart illustrating a method.

FIG. 18 is a schematic flowchart illustrating a method comprising:

generating (at a step 1800) a set of partial sum bits and a set of carry bits by carry-save-addition in respect of corresponding bit positions in a first input value, a second input value, a carry-in value associated with the first and second input values, and a third input value, the generating step including providing a relative inversion between the third input value and the group consisting of the first and second input values; and combining (at a step 1810) the set of partial sum bits, the set of carry bits offset by a predetermined number of bits in a more significant bit direction, the carry-in value and 1, to generate at least a carry output bit;

in which the carry output bit is indicative of whether the third input value is greater than the sum of the first and second input values.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as the processing element 12) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. Comparator circuitry comprising:
carry-save-addition (CSA) circuitry to generate a set of partial sum bits and a set of carry bits having a set of bit positions, each bit position corresponding to a respective bit position in each of a first input value, a second input value and a third input value, the CSA circuitry comprising inverter circuitry to provide inversion of one of the third input value and the group consisting of the first and second input values; and
combiner circuitry to combine the set of partial sum bits, the set of carry bits offset by a predetermined number of bits in a more significant bit direction, a carry-in value associated with the first and second input values and 1, to generate at least a carry output bit, wherein the carry output bit is indicative of whether the third input value is greater than a sum of the first and second input values.

2. Comparator circuitry according to claim 1, comprising an output bit inverter to invert the carry output bit.

3. Comparator circuitry according to claim 1, wherein the predetermined number of bits is one bit.

4. Comparator circuitry according to claim 1, comprising a selector configured to selectively set one of the first and second input values to zero.

5. Comparator circuitry according to claim 1, wherein the CSA circuitry is configured to generate the set of partial sum bits and the set of carry bits in dependence on the first input value, the second input value, and the inverse of the third input value.

6. Comparator circuitry according to claim 5, wherein the carry-save-addition circuitry comprises:
first circuitry to combine pairs of bits of the first input value and bits of the second input value to generate respective intermediate partial sum bits and respective intermediate carry bits; and
second circuitry to combine the intermediate partial sum bits and intermediate carry bits with the inverse of the third input value.

7. Comparator circuitry according to claim 1, wherein the CSA circuitry is configured to generate the set of partial sum bits and a set of carry bits in dependence upon the inverse of the first input value, the inverse of the second input value and the third input value.

8. Comparator circuitry according to claim 7, wherein the carry-save-addition circuitry comprises:
first circuitry to combine pairs of bits of the inverse of the first input value and bits of the inverse of the second input value to generate respective intermediate partial sum bits and respective intermediate carry bits; and
second circuitry to combine the intermediate partial sum bits and intermediate carry bits with the third input value.

9. Memory region detection circuitry comprising:
a detector to detect whether a memory address under test lies within a range of memory addresses defined by a lower limit and an upper limit, the detector comprising:
first comparator circuitry comprising:
carry-save-addition (CSA) circuitry to generate a set of partial sum bits and a set of carry bits having a set of bit positions, each bit position corresponding to a respective bit position in each of a first input value, a second input value and a third input value, the CSA circuitry comprising inverter circuitry to provide an inversion of one of the third input value and the group consisting of the first and second input values; and
combiner circuitry to combine the set of partial sum bits, the set of carry bits offset by a predetermined number of bits in a more significant bit direction, a carry-in value associated with the first and second input values and 1, to generate at least a carry output bit,
wherein the carry output bit is indicative of whether the third input value is greater than a sum of the first and second input values, wherein the third input value represents the lower limit;
second comparator circuitry comprising:
carry-save-addition (CSA) circuitry to generate a set of partial sum bits and a set of carry bits having a set of bit positions, each bit position corresponding to a respective bit position in each of a first input value, a second input value and a third input value, the CSA circuitry comprising inverter circuitry to provide an inversion of one of the third input value and the group consisting of the first and second input values; and combiner circuitry to combine the set of partial sum bits, the set of carry bits offset by a predetermined number of bits in a more significant bit direction, a carry-in value associated with the first and second input values and 1, to generate at least a carry output bit, wherein the carry output bit is indicative of whether the third input value is greater than a sum of the first and second input values, wherein the third input value represents the upper limit;

and output circuitry to generate an output flag in dependence upon the carry output bits from the first and second comparator circuitries, wherein the memory address under test is formed as a sum of the first input value, the second input value and the carry-in value, and the output flag indicates whether the memory address under test lies within the range of memory addresses defined by the lower limit and the upper limit.

10. Memory region detection circuitry according to claim 9, comprising two or more detectors each having a respective upper limit and lower limit.

11. Memory region detection circuitry according to claim 10, comprising circuitry to combine the output flags from the two or more detectors to generate a flag indicating whether the memory address under test lies within the range of memory addresses defined by the respective lower limit and the upper limit of at least one of the two or more detectors.

12. Memory region detection circuitry according to claim 11, wherein:

in the first comparator circuitry the carry-save-addition circuitry comprises:

first circuitry to combine pairs of bits of the first input value and bits of the second input value to generate respective intermediate partial sum bits and respective intermediate carry bits; and second circuitry to combine the intermediate partial sum bits and intermediate carry bits with the inverse of the third input value;

in the second comparator circuitry the carry-save addition circuitry comprises:

first circuitry to combine pairs of bits of the inverse of the first input value and bits of the inverse of the second input value to generate respective intermediate partial sum bits and respective intermediate carry bits; and second circuitry to combine the intermediate partial sum bits and intermediate carry bits with the third input value, wherein each of the two or more detectors has respective second circuitry; and the first circuitry of the first comparator of the two or more detectors are the same and the first circuitry of the second comparator of the two or more detectors are the same.

13. Memory region detection circuitry according to claim 9, comprising:

an address generator to generate a memory address from the first input value, the second input value and the carry-in value.

14. Memory region detection circuitry according to claim 13, wherein:

the address generator is configured to generate an address carry bit; and the combiner circuitry is configured to generate the carry output bit in dependence upon the address carry bit.

15. Memory region detection circuitry according to claim 9, comprising:

an interrupt generator configured to generate a processor interrupt in response to a memory address lying within the range of memory addresses defined by the lower limit and the upper limit.

16. Memory protection circuitry comprising:

memory region detection circuitry according to claim 9, wherein the upper limit and the lower limit define a given memory region having one or more associated attributes;

the memory protection circuitry being configured to control access to a memory address detected to be in the memory region in dependence upon the one or more associated attributes.

17. A saturating combiner comprising:

a data value combiner configured to combine two or more data values;

comparator circuitry according to claim 1, configured to compare an output of the data value combiner with one or more limit values; and a limiter responsive to the comparator circuitry to limit the output of the data value combiner to a limit value or the one or more limit values.

18. Comparator circuitry comprising:

carry-save-addition (CSA) means for generating a set of partial sum bits and a set of carry bits having a set of bit positions, each bit position corresponding to a respective bit position in each of a first input value, a second input value and a third input value, the CSA means comprising inverter means for inverting one of the third input value and the group consisting of the first and second input values; and combiner means for combining the set of partial sum bits, the set of carry bits offset by a predetermined number of bits in a more significant bit direction, a carry-in value associated with the first and second input values and 1, to generate at least a carry output bit, wherein the carry output bit is indicative of whether the third input value is greater than a sum of the first and second input values.

19. A method comprising:

generating a set of partial sum bits and a set of carry bits by carry-save-addition, the set of partial sum bits and the set of carry bits having a set of bit positions, each bit position corresponding to a respective bit position in each of a first input value, a second input value and a third input value, the generating step including inverting one of the third input value and the group consisting of the first and second input values; and combining the set of partial sum bits, the set of carry bits offset by a predetermined number of bits in a more significant bit direction, a carry-in value associated with the first and second input values and 1, to generate at least a carry output bit, wherein the carry output bit is indicative of whether the third input value is greater than a sum of the first and second input values.

* * * * *